(12) United States Patent
Chuang (10) Patent No.: US 11,282,789 B2
(45) Date of Patent: Mar. 22, 2022

(54) SEMICONDUCTOR STRUCTURE, MEMORY DEVICE, SEMICONDUCTOR DEVICE AND METHOD OF MANUFACTURING THE SAME

(71) Applicant: Changxin Memory Technologies, Inc., Anhui (CN)

(72) Inventor: Ling-Yi Chuang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/106,525

(22) Filed: Nov. 30, 2020

(65) Prior Publication Data

US 2021/0082817 A1 Mar. 18, 2021

Related U.S. Application Data

(63) Continuation of application No. PCT/CN2019/110017, filed on Oct. 8, 2019.

(30) Foreign Application Priority Data

Oct. 11, 2018 (CN) .......................... 201811185603.8
Oct. 11, 2018 (CN) .......................... 201821652441.X (51) Int. Cl.
*H03K 19/177* (2020.01)
*H01L 23/48* (2006.01)
(Continued)

(52) U.S. Cl.
CPC .......... *H01L 23/5286* (2013.01); *H01L 21/78* (2013.01); *H01L 22/22* (2013.01); *H01L 25/0657* (2013.01); *H01L 25/50* (2013.01)

(58) Field of Classification Search
CPC ........................... H01L 23/5286; H01L 24/06
See application file for complete search history.

(56) References Cited

U.S. PATENT DOCUMENTS 4,942,317 A * 7/1990 Tanaka ................ H01L 23/5286
257/203
4,970,572 A * 11/1990 Kato .................... H01L 23/5226
257/758
(Continued)

FOREIGN PATENT DOCUMENTS

CN 1607637 A 4/2005
CN 102124558 A 7/2011
(Continued)

OTHER PUBLICATIONS

PCT International Search Report and the Written Opinion dated Jan. 14, 2020, issued in related International Application No. PCT/CN2019/110017 (7 pages).

*Primary Examiner* — Bradley Smith
*Assistant Examiner* — David J Goodwin
(74) *Attorney, Agent, or Firm* — Sheppard Mullin Richter & Hampton LLP (57) ABSTRACT

A semiconductor structure, a memory device, a semiconductor device and a semiconductor device manufacturing method are provided. The semiconductor structure includes a die, a power bus and a first pad assembly. The power bus is disposed on the die and extends in a predetermined direction. The first pad assembly is arranged on one side of the power bus. The first pad assembly includes at least four pads separated from one another along the predetermined direction by the first, the second and the third gaps. The first gap and the second gap both have a width larger than a width of the third gap and the first pad assembly includes a power pad coupled to the power bus and located between the first gap and the second gap. The power pad and the first and second gaps are all located between opposing ends of the power bus.

20 Claims, 3 Drawing Sheets

(51) Int. Cl.
   *H01L 23/528*    (2006.01)
   *H01L 21/78*     (2006.01)
   *H01L 21/66*     (2006.01)
   *H01L 25/065*    (2006.01)
   *H01L 25/00*     (2006.01)

(56) References Cited

U.S. PATENT DOCUMENTS

| | | | | |
|---|---|---|---|---|
| 4,975,758 A | * | 12/1990 | Crafts | H01L 27/11898 257/203 |
| 5,581,109 A | * | 12/1996 | Hayashi | H01L 23/5286 257/503 |
| 5,760,428 A | * | 6/1998 | Colwell | H01L 27/11807 257/202 |
| 6,114,749 A | * | 9/2000 | Chia | H01L 23/057 257/666 |
| 6,770,963 B1 | * | 8/2004 | Wu | H01L 23/50 257/691 |
| 7,554,133 B1 | * | 6/2009 | Ali | H01L 23/5286 257/203 |
| 7,985,625 B2 | | 7/2011 | Yamaguchi et al. | |
| 2007/0187814 A1 | * | 8/2007 | Cusack | H01L 23/5286 257/723 |
| 2012/0119785 A1 | * | 5/2012 | Turner | H01L 24/06 326/101 |
| 2012/0225501 A1 | | 9/2012 | Kim | |
| 2014/0048907 A1 | * | 2/2014 | Yoon | H01L 28/40 257/532 |

FOREIGN PATENT DOCUMENTS

| | | |
|---|---|---|
| CN | 109390304 A | 2/2019 |
| CN | 208835046 U | 5/2019 |
| JP | 08-279358 A | 10/1996 |
| JP | 2002-076068 A | 3/2002 |

* cited by examiner

SEMICONDUCTOR STRUCTURE, MEMORY DEVICE, SEMICONDUCTOR DEVICE AND METHOD OF MANUFACTURING THE SAME

CROSS-REFERENCE TO RELATED APPLICATIONS

This application is a continuation application of International Patent Application No. PCT/CN2019/110017, filed on Oct. 8, 2019, which is based on and claims priority of the Chinese Patent Applications No. 201811185603.8, and No. 201821652441.X, both filed on Oct. 11, 2018. The above-referenced applications are incorporated herein by reference in their entirety.

TECHNICAL FIELD

The present invention relates generally to semiconductor technology and, more specifically, to a semiconductor structure, a memory device, a semiconductor device and their manufacturing methods.

BACKGROUND

With the technical advancement in semiconductor technology, die stacking techniques have been widely adopted in various memories such as dynamic random access memory (DRAM) devices. In die stacking, multiple dies may be stacked and connected together to form an integrated component to achieve higher performance.

However, one or more dies in the stacked dies may inevitably have circuit defects, which may lead to circuit malfunction or current leakage of the die and cause die failure. Incorporating a defective die in the stacked dies may cause the stack to malfunction, deteriorating the yield of final products.

It is to be noted that the above information disclosed in this Background section is only for facilitating the understanding of the background of the invention and therefore may contain information that does not form the prior art that is already known to a person of ordinary skill in the art.

SUMMARY

In view of the limitations of existing technologies described above, this disclosure provides a semiconductor structure, a memory device, a semiconductor device and related manufacturing methods that address the aforementioned limitations. This invention avoids the scraping of an entire stack of dies due to one defective die thereon and thus improves the product yield.

One aspect of the present invention is directed to a semiconductor structure. The semiconductor structure may include a die, a power bus arrange on the die and extending in a predetermined direction, and a first pad assembly arranged on the die and on a first side of the power bus. The first pad assembly may include at least four pads separated from one another along the predetermined direction by gaps in the first pad assembly. The gaps in the first pad assembly may include a first gap, a second gap and a third gap. The first gap and the second gap may each have a width larger than a width of the third gap, and the at least four pads in the first pad assembly may include a power pad coupled to the power bus and located between the first gap and the second gap. The power pad and the first and the second gaps may all locate between opposing ends of the power bus.

In some embodiments of the present invention, the at least four pads in the first pad assembly may further include: a first pad located on a first side of the power pad and adjacent to the power pad, a second pad located on a second side of the power pad opposing the first side of the power pad and adjacent to the power pad, and a third pad located on a side of the first pad away from the power pad. The first pad and the power pad may be separated by the first gap, the second pad and the power pad may be separated by the second gap, and the third pad and the first pad may be separated by the third gap.

In some embodiments of the present invention, the width of at least one of the first gap and the second gap may be not smaller than 15 µm.

In some embodiments of the present invention, the semiconductor structure may further include a second pad assembly arranged on a second side of the power bus opposing the first side of the power bus. The second pad assembly may include at least three pads separated from one another along the predetermined direction by gaps in the second pad assembly. The gaps in the second pad assembly may include a fourth gap and a fifth gap. The fourth gap and the fifth gap may each have a width larger the width of the third gap, the fourth gap may face toward the first gap, and the fifth gap may face toward the second gap.

In some embodiments of the present invention, the width of at least one of the fourth gap and fifth gap may be not smaller than 15 µm.

In some embodiments of the present invention, the width of the first gap may be equal to the width of the fourth gap, and the width of the second gap may be equal to the width of the fifth gap.

Another aspect of the present invention is direct to a semiconductor device. The semiconductor device may include a plurality of semiconductor structures stacked over each other. Each of the plurality of semiconductor structure may include a die, a power bus arranged on the die and extending in a predetermined direction, and a first pad assembly arranged on the die and on a first side of the power bus. The first pad assembly may include at least four pads separated from one another along the predetermined direction by gaps in the first pad assembly, and the gaps in the first pad assembly may include a first gap, a second gap and a third gap. The first gap and the second gap may each have a width larger than a width of the third gap. The at least four pads in the first pad assembly may include a power pad coupled to the power bus and located between the first gap and the second gap, and the power pad and the first and the second gaps may all locate between opposing ends of the power bus.

In some embodiments of the present invention, in each of the plurality of semiconductor structures, the at least four pads of the first pad assembly may further include a first pad located on a first side of the power pad and adjacent to the power pad, a second pad located on a second side of the power pad opposing the first side of the power pad and adjacent to the power pad, and a third pad located on a side of the first pad away from the power pad. The first pad and the power pad may be separated by the first gap, the second pad and the power pad may be separated by the second gap, and the third pad and the first pad may be separated by the third gap.

In some embodiments of the present invention, in each of the plurality of semiconductor structures, the width of at least one of the first gap and the second gap is not smaller than 15 µm.

In some embodiments of the present invention, each of the plurality of semiconductor structures may further include a second pad assembly arranged on a second side of the power bus opposing the first side of the power bus. The second pad assembly may include at least three pads separated from one another along the predetermined direction by gaps in the second pad assembly. The gaps in the second pad assembly may include a fourth gap and a fifth gap, the fourth gap and the fifth gap may each have a width larger the width of the third gap, the fourth gap may face toward the first gap, and the fifth gap may face toward the second gap.

In some embodiments of the present invention, in each of the plurality of semiconductor structures, the width of at least one of the fourth gap and the fifth gap may not be smaller than 15 μm.

In some embodiments of the present invention, in each of the plurality of semiconductor structures, the width of the first gap may be equal to the width of the fourth gap, and the width of the second gap may be equal to the width of the fifth gap.

Another one aspect of the present invention is directed to a memory device, comprising the semiconductor device of any of the aforementioned embodiments.

In some embodiments of the present invention, in each of the plurality of semiconductor structures in the semiconductor device, the width of at least one of the first gap and the second gap may not be smaller than 15 μm.

Another one aspect of the present invention is directed to a semiconductor device manufacturing method. The method may include: providing a plurality of wafers, each containing a plurality of semiconductor structures as defined in any one of the aforementioned embodiments. Each of the plurality of semiconductor structures may be separated from one another.

The method may further include testing the dies in the plurality of semiconductor structures in each of the plurality of wafers, identifying a die with a circuit defect in any of the plurality of semiconductor structures a target die, cutting the power bus at the first gap and the second gap in the semiconductor structure with the target die, and stacking the plurality of wafers over each other. Corresponding dies in neighboring wafers may face each other.

In some embodiments of the present invention, cutting the power bus at the first gap and the second gap in the semiconductor structure with the target die may include: cutting the power bus with a laser at the first gap and the second gap in the semiconductor structure with the target die.

In some embodiments of the present invention, the aforementioned method may further include: cutting the plurality of wafers stacked over each other along a gap between two adjacent semiconductor structures to slice the plurality of wafers stacked over each other.

In the semiconductor structure, memory device, semiconductor device and related manufacturing methods of the present invention, the first gap and second gap sandwich the power pad and are both wider than the third gap, they provide channels for cutting the power bus. Thus, if a circuit failure occurs in a die, the power bus corresponding to the die may be cut at the first gap and the second gap to disconnect the defective die from the system, so that it will not cause electric leakage or other issues during operation of the final product. That avoids the scrappage of the final product due to one defective die and thus improves the product yield.

BRIEF DESCRIPTION OF THE DRAWINGS

The accompanying drawings, which are incorporated in and constitute a part of the description, illustrate embodiments consistent with the present invention and, together with the description, serve to explain the disclosed principles. It is apparent that these drawings present only some embodiments of the present invention and those of ordinary skill in the art may obtain drawings of other embodiments from them without exerting any creative effort.

LIST OF REFERENCE NUMERALS IN DRAWINGS

100: semiconductor structure; 1: die; 101: substrate; 102: insulating layer;
2: power bus; 3: first pad assembly; 301: first gap; 302: second gap; 303: third gap; 31: power pad; 32: first pad; 33: second pad; 34: third pad;
4: second pad assembly; 401: fourth gap; 402: fifth gap; 41: fourth pad; 42: fifth pad; 43: sixth pad;
200: wafer; 300: TSV; 400: dicing apparatus.

DETAILED DESCRIPTION OF THE EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of the present invention and to fully convey the concepts of the exemplary embodiments to others skilled in the art. In the figures, like reference numerals indicate the same or analogous elements, and duplicate detailed description thereof will thus be omitted.

Although relative terms such as "upper" and "lower" may be used herein to describe a spatial relationship of one component to another in a device shown in the figures, they are used merely for the purpose of easy description based on, for example, the exemplary orientation depicted in the figures. It is to be understood that if the illustrated device is turned upside down, then the component described as being "upper" will now be a "lower" component. When a certain structure is described as being "on" another structure, it is possible that the specific structure is either integrally formed on the other structure or disposed thereon "directly" or "indirectly" via an intervening structure.

As used herein, the terms "a", "an" "the", "said" and "at least one" are intended to mean that there are one or more elements/components/etc. As used herein, the terms "including" and "having" are intended to be used in an open-ended sense to mean that there are possibly other element(s)/component(s)/etc. apart from the listed element(s)/component(s)/etc. The terms "first", "second", "third", etc. as used herein are meant as labels rather than place a quantitative limitation upon the amount of the mentioned items.

Figure 1:
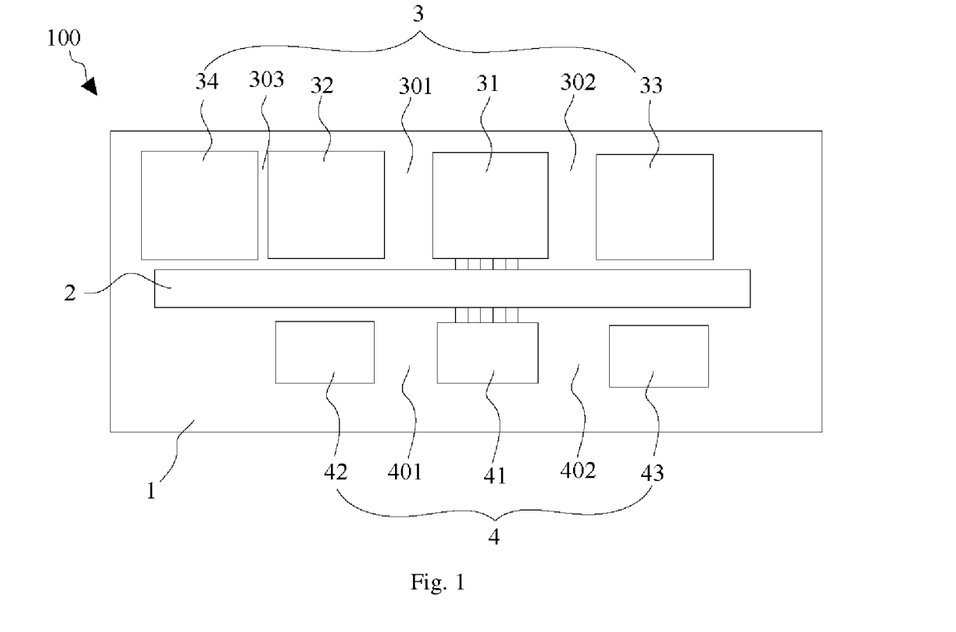
FIG. 1 is a schematic illustration of a semiconductor structure, in which a power bus has not been cut, in accordance with one embodiment of the present invention.

This invention first provides a semiconductor structure. The semiconductor structure may be incorporated into a semiconductor device, which may include a plurality of such semiconductor structures. As shown in FIG. 1, the semiconductor structure 100 in accordance with one embodiment of the present invention may include a die 1, a power bus 2 and a first pad assembly 3.

The power bus 2 may be arranged on the die 1 and extend in a predetermined direction.

The first pad assembly 3 may be arranged on the die 1 and on a first side (e.g., an upper side as shown in FIG. 1) of the power bus 2. The first pad assembly 3 may include at least four pads separated from one another along the predetermined direction by several gaps in the first pad assembly 3. The gaps may include a first gap 301, a second gap 302 and a third gap 303. The first gap 301 and the second gap 302 may both have a width larger than a width of the third gap 303. The pads in the first pad assembly 3 may include a power pad 31, which may be coupled to the power bus 2 and located between the first gap 301 and the second gap 302. The power pad 31, the first gap 301 and the second gap 302 may all be situated between opposing ends of the power bus 2.

Figure 2:
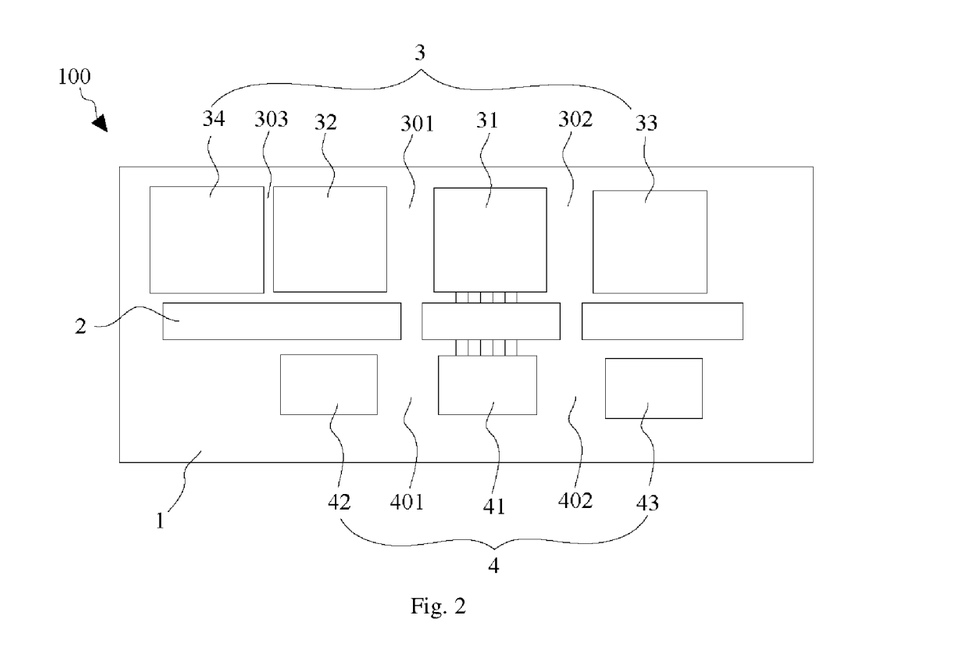
FIG. 2 is a schematic illustration of a semiconductor structure, in which the power bus has been cut, in accordance with one embodiment of the present invention.

In the semiconductor structure 100 in accordance with one embodiment of the present invention, the first gap 301 and the second gap 302 may sandwich the power pad 31 and may both be wider than the third gap 303, thus the first gap 301 and the second gap 302 may provide channels for cutting the power bus 2. If a circuit failure occurs in the die, the power bus 2 may be cut at the first gap 301 and the second gap 302, as shown in FIG. 2, to disconnect the defective die. Thus the defective die will not cause electric leakage or other issues during operation of the final product, and the final product does not need to be scrapped due to a defect in one die, thereby improving the product yield.

The various components of the semiconductor structure 100 will be described in further detail below.

As shown in FIG. 1, the die 1 may include a predefined circuit and the first pad assembly 3 may be disposed on the die 1 and connected to the predefined circuit. Specific structure of the predefined circuit is not limited in this invention.

Figure 3:
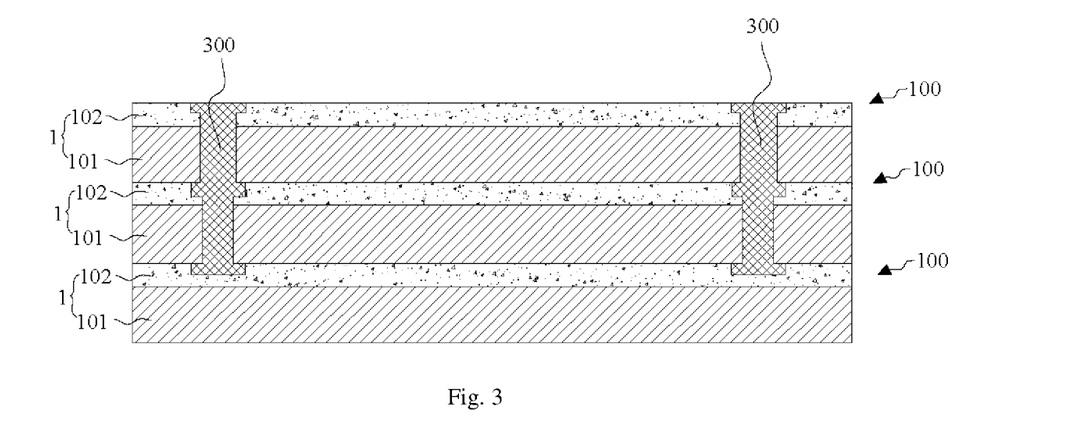
FIG. 3 is a schematic illustration of a semiconductor device in accordance with one embodiment of the present invention.

For example, as shown in FIG. 3, the die 1 may include a substrate 101 and an insulating layer 102. The substrate 101 may be formed of silicon or any other suitable semiconductor material. Specific shape or size of the substrate 101 are not limited in this invention. The insulating layer 102 may be formed on the substrate 101 and be made of, for example, silica, silicon nitride, or a mixture of several insulating materials.

As shown in FIG. 1, the power bus 2 may be disposed on the die 1 and may extend in the predetermined direction. The power bus 2 may be attached to the surface of the die 1 or embedded in the surface of the die 1, and the predetermined direction may be an arbitrary direction in the plane where the power bus 2 is located. For example, the die 1 may be rectangular, and the predetermined direction may be a direction parallel to one side of the die 1. The power bus 2 may have a straight line structure (i.e., extending exactly in the predetermined direction). The power bus 2 may also have a curved structure, provided that it generally follows the predetermined direction. In addition, the power bus 2 may be made of copper or any other suitable metallic materials that is electrically conductive.

As shown in FIG. 1, the first pad assembly 3 may be disposed on the die 1 and on the first side (e.g., the upper side as shown in FIG. 1) of the power bus 2. The first pad assembly 3 may include several gaps separated apart from one another along the predetermined direction. The number of the gaps in the first pad assembly 3 may be at least three. The gaps may include a first gap 301, a second gap 302 and a third gap 303. The first gap 301 and the second gap 302 may be located between two ends of the power bus 2, and the third gap 303 may be situated on a side of the first gap 301 farther away from the second gap 302. Apparently, the third gap 303 may be alternatively arranged between the first gap 301 and the second gap 302, or on the side of the second gap 302 farther away from the first gap 301. This invention is not limited in this regard.

The first gap 301 and the second gap 302 may both have a width larger than a width of the third gap 303. For example, the widths of the first gap 301 and the second gap 302 may be both not smaller than 15 μm (i.e., larger than or equal to 15 μm). For example, the widths of the first gap 301 and the second gap 302 may be 15 μm, 16 μm, or 17 μm. The width of the third gap 303 may be smaller than 15 μm. Further, the widths of the first gap 301 and the second gap 302 may be identical to or different with each other, and this invention is not limited in this regard.

The gaps may be located between the pads in the first pad assembly 3. Since the number of the gaps in the first pad assembly 3 is at least three, the number of the pads in the first pad assembly 3 is at least four. For example, each of the pads in the first pad assembly 3 may be disposed on the side of the insulating layer 102 farther away from the first substrate 101, and may be embedded in the insulating layer 102 so as to be flush with the surface thereof farther away from the first substrate 101. The pads may be made of a metal, such as copper, aluminum, tungsten, or other suitable metallic materials, which are not exhaustively enumerated herein. The pads may be rectangular, circular or other shapes in a plan view.

As shown in FIG. 1, the pads in the first pad assembly 3 may include a power pad 31 situated between the opposing ends of the power bus 2 and coupled to the power bus 2 and thereby to a power supply to which the power bus 2 is connected. Additionally, the power pad 31 may be sandwiched between the first gap 301 and the second gap 302, so that two channels that are wider than the third gap 303 may be created on both sides of the power pad 31. If any circuit failure occurs in the die 1 of the semiconductor structure 100, the power bus 2 may be cut off at positions defined by the first gap 301 and the second gap 302, thus electrically isolating this defective die and avoiding scrappage of the final product due to electric leakage or circuit failure caused by the defective die. Thus, the product yield can be increased.

As shown in FIG. 1, the pads in the first pad assembly 3 may further include a first pad 32, a second pad 33 and a third pad 34.

The first pad 32 may be located next to the power pad 31 and on a first side of the power pad 31. In other words, among the multiple pads, the first pad 32 and the power pad 31 are two adjacent pads. The first pad 32 and the power pad 31 may be separated by the first gap 301. That is, among the gaps in the first pad assembly 3, the first gap 301 is the one that separates the first pad 32 from the power pad 31. The first pad 32 may be coupled to a signal line so as to be able to receive a control or data signal. Specific function of the first pad 32 is not limited in this invention. The first pad 32 may have the same shape and size as the power pad 31, or a shape and/or size different with those of the power pad 31, and this invention is not limited in this regard.

The second pad 33 may be located next to the power pad 31 and on a second side of the power pad 31 opposing the first side of the power pad 31 (i.e., a side that is farther away from the first pad 32). In other words, among the multiple pads in the first pad assembly 3, the first pad 32 and the second pad 33 may be located on two opposing sides of the power pad 31. The second pad 33 and the power pad 31 may be separated by the second gap 302. That is, among the gaps in the first pad assembly 3, the second gap 302 is the one that separates the second pad 33 from the power pad 31. The second pad 33 may be used for grounding. The second pad may also be used to implement other functions, and the present invention is not limited in this regard. The second pad 33 may have the same shape and size as the power pad 31, or a shape and/or size different with those of the power pad 31, and this invention is not limited in this regard.

As shown in FIG. 1, the third pad 34 may be located next to the first pad 32 and on a side of the first pad 32 that is farther from the power pad 31. The third pad 34 may be used for grounding. The third pad 34 may also be used to implement other functions, and the present invention is not limited in this regard. The third pad 34 and the first pad 32 may be separated by the third gap 303. The third gap 303 may have a width of smaller than 15 μm (e.g., 8 μm, 5 μm). Such a reduced spacing between the third pad 34 and the first pad 32 may help to reduce the overall footprint of the semiconductor structure 100.

As shown in FIG. 1, the semiconductor structure 100 in accordance with one embodiment of this invention may further include a second pad assembly 4. The second pad assembly 4 may be disposed on the die 1, and on a second side of the power bus 2 opposing the first side of the power bus 2 (i.e., a side farther from the first pad assembly 3). The second pad assembly 4 may include several gaps separated from one another in the predetermined direction. The number of the gaps in the second pad assembly 4 may be at least two (e.g., three or more). The gaps in the second pad assembly 4 may include a fourth gap 401 and a fifth gap 402. The fourth gap 401 and the fifth gap 402 may be located between the opposing ends of the power bus 2. The fourth gap 401 and the fifth gap 402 may both have a width not smaller than the width of the third gap 303. For example, the widths of the fourth gap 401 and the fifth gap 402 may be not smaller than 15 μm (i.e., larger than or equal to 15 μm). For example, the widths of the fourth gap 401 and the fifth gap 402 may be 15 μm, 16 μm, or 17 μm.

The widths of the fourth gap 401 and fifth gap 402 may be identical to or different from each other. Additionally, the fourth gap 401 may face toward the first gap 301, and the width of the fourth gap 401 may be equal to the width of the first gap 301 so as to provide one of the channels for cutting the power bus 2. Likewise, the fifth gap 402 may face toward the second gap 302, and the width of the fifth gap 402 may be equal to the width of the second gap 302 so as to provide the other of the channels for cutting the power bus 2.

As shown in FIG. 1, the aforementioned gaps in the second pad assembly 4 may be located between the pads in the second pad assembly 4. Since the number of the gaps in the second pad assembly 4 is at least two, the number of the pads in the second pad assembly 4 is at least three. For example, each of the pads in the second pad assembly 4 may be disposed on the side of the insulating layer 102 farther away from the first substrate 101, and may be embedded in the insulating layer 102 so as to be flush with the surface thereof farther away from the first substrate 101. The pads in the second pad assembly 4 may be made of a metal, such as copper, aluminum, tungsten, or other suitable metallic materials, which are not exhaustively enumerated herein. The pads in the second pad assembly 4 may be rectangular, circular or other shapes in a plan view.

As shown in FIG. 1, in some embodiments, the pads in the second pad assembly 4 may include a fourth pad 41, a fifth pad 42 and a sixth pad 43. The fourth pad 41 may face toward the power pad 31 and be coupled to the power bus 2. The fifth pad 42 may face toward the first pad 32, and the sixth pad 43 may face toward the second pad 33. The fourth pad 41 and the fifth pad 42 may be separated by the fourth gap 401, and the fourth pad 41 and the sixth pad 43 may be separated by the fifth gap 402.

As shown in FIG. 2, the power bus 2 may be cut by a laser when the semiconductor structure 100 is determined to be defective in order to prevent electric leakage from the power bus 2. Specifically, the laser may be moved from the first gap 301, across the power bus 2 and into the fourth gap 401, and then from the second gap 302, across the power bus 2 and into the fifth gap 402, thus cutting the power bus 2 into separate pieces. In embodiments of the semiconductor structure 100 without the second pad assembly 4 including the fourth gap 401 and the fifth gap 402, the laser may be moved from the first gap 301 toward the power bus 2 and across the power bus 2, and then from the second gap 302 toward the power bus 2 and across the power bus 2.

This invention further provides a semiconductor device including a plurality of dies such as, without limitation, DRAM dies, stacked over each other. As shown in FIG. 3, the semiconductor device may include a plurality of semiconductor structures 100 as defined above, and the plurality of semiconductor structures 100 may be stacked over each other.

Two adjacent semiconductor structures 100 of the plurality of semiconductor structures 100 may be bonded and connected via through silicon vias (TSVs) 300. In one embodiment, the pads in each of the semiconductor structures 100 may be located corresponding to the respective pads in the adjacent semiconductor structure(s) 100. The TSVs may connect corresponding pads in the second pad assemblies 4 in the semiconductor structures 100 so as to accomplish the connection of the stacked semiconductor structures 100.

For example, in any two adjacent semiconductor structures 100 of the plurality of semiconductor structures 100, the fourth pad 41 in the overlying semiconductor structure 100 may be coupled to the fourth pad 41 in the underlying semiconductor structure 100 via a TSV, and the fifth pad 42 in the overlying semiconductor structure 100 may be coupled to fifth pad 42 in the underlying semiconductor structure 100 via another TSV. Likewise, the sixth pad 43 in the overlying semiconductor structure 100 may be coupled to the sixth pad 43 in the underlying semiconductor structure 100 via another TSV.

Since the semiconductor device includes the aforementioned semiconductor structures 100, the power bus 2 of any die that is determined to have a circuit defect during the fabrication may be cut off. Thus, electric leakage or other issues of the semiconductor device that may arise from the defective die may be prevented, and the product yield may be increased.

Figure 4:
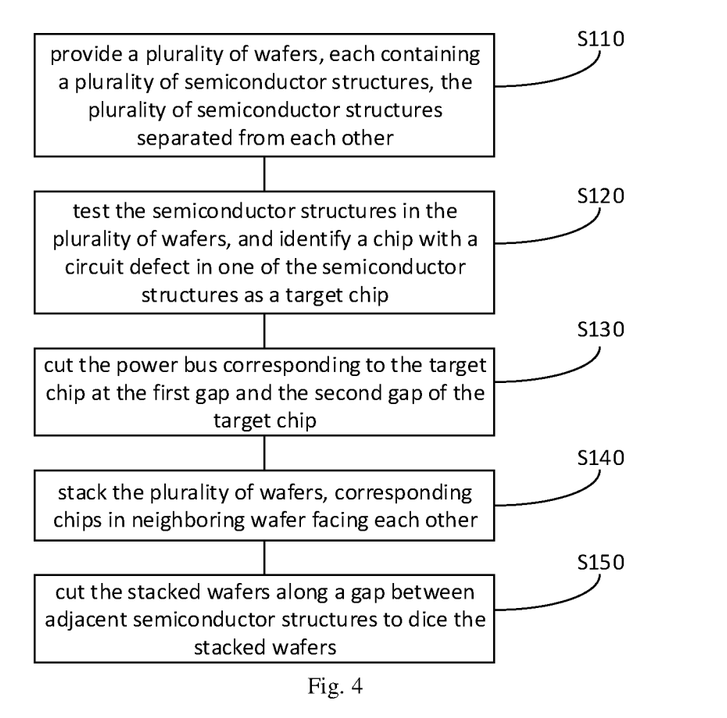
FIG. 4 is a flowchart of a semiconductor device manufacturing method in accordance with one embodiment of the present invention.

This invention further provides a semiconductor device manufacturing method for the aforementioned semiconductor device. As shown in FIG. 4, the method may include the following steps.

In step S110, a plurality of wafers may be provided. Each of the plurality of wafers may contain a plurality of aforementioned semiconductor structures. The plurality of semiconductor structures may be separated from one another.

In step S120, each of the plurality of semiconductor structures in the plurality of wafers may be tested, and a die with a circuit defect in one of the plurality of semiconductor structures may be identified as a target die.

In step S130, the power bus corresponding to the target die may be cut at the first gap and the second gap of the target die.

In step S140, the plurality of wafers may be stacked over each other, and corresponding dies in neighboring wafers may face each other.

In this semiconductor device manufacturing method, the dies in the semiconductor structures are tested to determine whether any one of the dies has a circuit defect, and the power bus 2 corresponding to an identified defective die may be cut at the first gap 301 and the second gap 302. Thus, the semiconductor device incorporating the defective die will not suffer from electric leakage or other problems arising from the defective die, and the product yield may be increased.

The steps in the manufacturing method will be described in greater details below.

Figure 5:
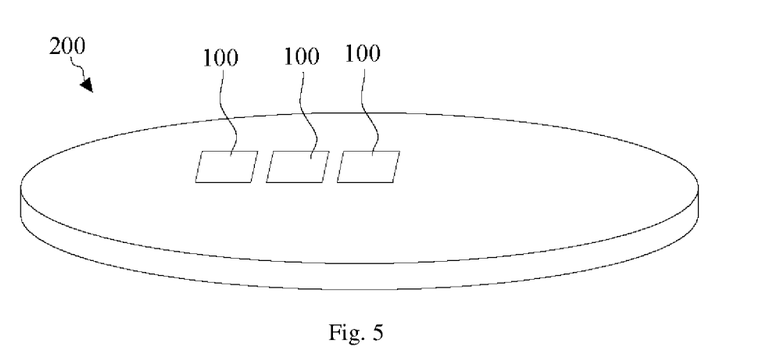
FIG. 5 depicts step S110 in the method of FIG. 4.

In step S110, a plurality of wafers each containing a plurality of aforementioned semiconductor structures may be provided. The plurality of semiconductor structures in each wafer may be separated from one another.

As shown in FIG. 5, a wafer 200 may include a plurality of semiconductor structures 100. The number of semiconductor structures 100 in the wafer 200 is not limited in this invention. The wafer 200 may be circular, or other suitable shape in a plan view. Relevant parts in the aforementioned embodiments may be referred to for structural details of each of the semiconductor structures 100, which will not be repeatedly described herein for the sake of conciseness.

In step S120, the plurality of semiconductor structures in the plurality of wafers may be tested, and a die with a circuit defect in one of the semiconductor structures may be identified as a target die.

Dedicated testers may be used to test the dies 1 in the semiconductor structures 100 to determine if any of the dies 1 has a circuit defect such as electric leakage or malfunction. Specific method of testing the semiconductor structures is not limited in this invention, provided that it is capable of detecting a circuit defect. Any die that is determined to have a circuit defect can be identified as a target die. If no die is determined to have a circuit defect, then there will be no such a target die.

In step S130, the power bus corresponding to the target die may be cut at the first gap and the second gap of the target die.

As shown in FIG. 2, the first gap 301 and the second gap 302 may provide gaps for cutting the power bus 2. For example, the power bus 2 corresponding to the target die may be cut with a laser at the first gap and the second gap of the target die so that no current will leak from the ends of the power bus 2. Thus the adverse effect of the leakage current to the semiconductor device may be avoided.

In the embodiments in which the defective die 1 in the semiconductor structures 100 includes the fourth gap 401 and the fifth gap 402, the laser may be moved from the first gap 301, across the power bus 2 and into the fourth gap 401, thus cutting the power bus 2 into two pieces. Subsequently, the laser may be moved the second gap 302, across the power bus 2 and into the fifth gap 402, again cutting apart the power bus 2.

Alternatively, the power bus 2 may be cut by laser direct imaging (LDI), photolithography, or any other suitable methods, and this invention is not limited in this regard.

Figure 6:
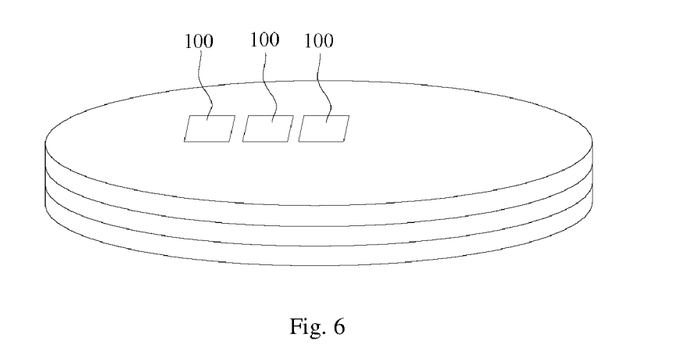
FIG. 6 depicts step S140 in the method of FIG. 4.

In step S140, the plurality of wafers may be stacked together, and corresponding dies in neighboring wafers may face each other.

As shown in FIG. 6, the plurality of wafers 200 may be stacked to form a multi-layer structure in which the dies 1 in the semiconductor structures 100 on any two adjacent wafers 200 may correspond to each other, respectively. In other words, a projection of a die 1 in a wafer 200 on an adjacent wafer 200 may coincide with a corresponding die 1 in the adjacent wafer 200. In addition, any two adjacent wafers 200 may be bonded together with TSVs 300 connecting the corresponding dies. In particular, the TSVs 300 may connect corresponding pads in the second pad assemblies 4 of the dies 1. Specific structure and implementation method of the TSVs 300 are not limited in this invention, provided that they are able to connect the pairs of dies 1.

Figure 7:
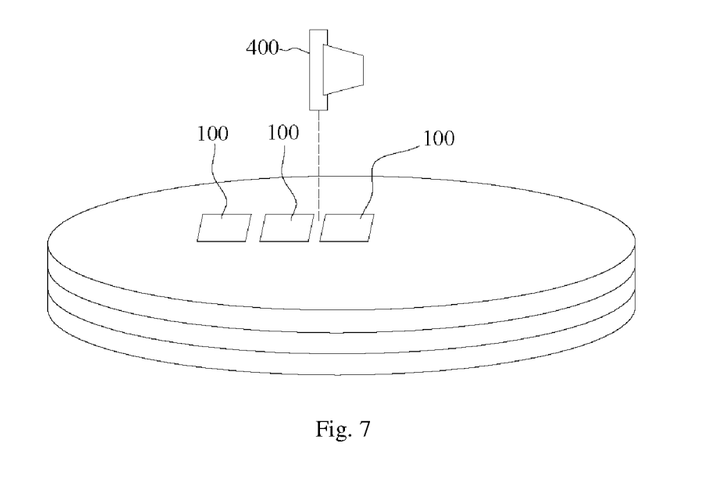
FIG. 7 depicts step S150 in the method of FIG. 4.

The manufacturing method of the embodiment may further include a step S150, in which the stacked wafers are cut along a gap between adjacent semiconductor structures, so that the stacked wafers are diced.

As shown in FIG. 7, each of the stacked wafers 200 may be cut by a laser dicing apparatus 400 in a laser cutting process to obtain a plurality of semiconductor devices, each including a plurality of stacked semiconductor structures 100. Specifically, the lasers can be used to cut the stacked wafers 200 in the gap between two adjacent semiconductor structures 100 until a plurality of independent semiconductor devices are formed.

This invention further provides a memory device including the aforementioned semiconductor device. The memory device may be, for example, a PC memory. Relevant parts in the aforementioned embodiments may be referred to for structural details of the semiconductor device and for beneficial effects of the memory device, which will not be repeatedly described herein for the sake of conciseness.

The accompanying drawings are illustrative of a series of processes included in the method according to exemplary embodiments of the present invention and are not intended to be limiting. It will be readily appreciated that the way in which the processes are illustrated does not indicate any chronological order of them or limit them to a particular chronological order. Furthermore, it will also be readily appreciated that the processes may be performed, for example, synchronously or asynchronously in multiple modules.

Other embodiments of the present invention will be apparent to those skilled in the art from considering the specification and practicing the invention disclosed herein. Accordingly, the present invention is intended to cover all and any variations, uses, or adaptations of the present invention which follow, in general, the principles thereof and include such departures from the present invention as come within common knowledge or customary practice within the art to which the invention pertains. It is also intended that the specification and examples be considered as exemplary only, with true scope and spirit of the present invention being indicated by the appended claims.

The invention claimed is:

1. A semiconductor structure, comprising:
   a die;

a power bus arranged on the die and extending in a predetermined direction; and a first pad assembly arranged on the die and on a first side of the power bus, the first pad assembly comprising at least four pads separated from one another along the predetermined direction by gaps in the first pad assembly, the gaps in the first pad assembly comprising a first gap, a second gap and a third gap, the first gap and the second gap each having a width larger than a width of the third gap, the at least four pads in the first pad assembly comprising a power pad coupled to the power bus and located between the first gap and the second gap, the power pad and the first and the second gaps all located between opposing ends of the power bus, wherein the power bus is severed at a first position and a second position, the first position aligned with the first gap along a severance direction perpendicular to the power bus, the second position aligned with the second gap along the severance direction.

2. The semiconductor structure of claim 1, wherein the at least four pads of the first pad assembly further comprise:

a first pad located on a first side of the power pad and adjacent to the power pad, the first pad and the power pad separated by the first gap;

a second pad located on a second side of the power pad opposing the first side of the power pad and adjacent to the power pad, the second pad and the power pad separated by the second gap; and a third pad located on a side of the first pad away from the power pad, the third pad and the first pad separated by the third gap.

3. The semiconductor structure of claim 1, wherein the width of at least one of the first gap and the second gap is not smaller than 15 µm.

4. The semiconductor structure of claim 3, further comprising:

a second pad assembly arranged on a second side of the power bus opposing the first side of the power bus, the second pad assembly comprising at least three pads separated from one another along the predetermined direction by gaps in the second pad assembly, the gaps in the second pad assembly comprising a fourth gap and a fifth gap, the fourth gap and the fifth gap each having a width larger the width of the third gap, the fourth gap facing toward the first gap, the fifth gap facing toward the second gap.

5. The semiconductor structure of claim 4, wherein the width of at least one of the fourth gap and the fifth gap is not smaller than 15 µm.

6. The semiconductor structure of claim 4, wherein the width of the first gap is equal to the width of the fourth gap, and the width of the second gap is equal to the width of the fifth gap.

7. A semiconductor device, comprising:

a plurality of semiconductor structures stacked over each other, wherein each of the plurality of semiconductor structures comprises:

a die;

a power bus arranged on the die and extending in a predetermined direction; and a first pad assembly arranged on the die and on a first side of the power bus, the first pad assembly comprising at least four pads separated from one another along the predetermined direction by gaps in the first pad assembly, the gaps in the first pad assembly comprising a first gap, a second gap and a third gap, the first gap and the second gap each having a width larger than a width of the third gap, the at least four pads in the first pad assembly comprising a power pad coupled to the power bus and located between the first gap and the second gap, the power pad and the first and the second gaps all located between opposing ends of the power bus, wherein the power bus is severed at a first position and a second position, the first position aligned with the first gap along a severance direction perpendicular to the power bus, the second position aligned with the second gap along the severance direction.

8. The semiconductor device of claim 7, wherein, in each of the plurality of semiconductor structures, the at least four pads of the first pad assembly further comprise:

a first pad located on a first side of the power pad and adjacent to the power pad, the first pad and the power pad separated by the first gap;

a second pad located on a second side of the power pad opposing the first side of the power pad and adjacent to the power pad, the second pad and the power pad separated by the second gap; and a third pad located on a side of the first pad away from the power pad, the third pad and the first pad separated by the third gap.

9. The semiconductor device of claim 7, wherein, in each of the plurality of semiconductor structures, the width of at least one of the first gap and the second gap is not smaller than 15 µm.

10. The semiconductor device of claim 9, wherein each of the plurality of semiconductor structures further comprises:

a second pad assembly arranged on a second side of the power bus opposing the first side of the power bus, the second pad assembly comprising at least three pads separated from one another along the predetermined direction by gaps in the second pad assembly, the gaps in the second pad assembly comprising a fourth gap and a fifth gap, the fourth gap and the fifth gap each having a width larger the width of the third gap, the fourth gap facing toward the first gap, the fifth gap facing toward the second gap.

11. The semiconductor device of claim 10, wherein, in each of the plurality of semiconductor structures, the width of at least one of the fourth gap and the fifth gap is not smaller than 15 µm.

12. The semiconductor device of claim 10, wherein, in each of the plurality of semiconductor structures, the width of the first gap is equal to the width of the fourth gap, and the width of the second gap is equal to the width of the fifth gap.

13. A memory device, comprising the semiconductor device of claim 7.

14. The memory device of claim 13, wherein in each of the plurality of semiconductor structures in the semiconductor device, the width of at least one of the first gap and the second gap is not smaller than 15 µm.

15. A semiconductor device manufacturing method, comprising:

providing a plurality of wafers, each containing a plurality of semiconductor structures separated from one another, wherein each of the plurality of semiconductor structures comprises:

a die;

a power bus arranged on the die and extending in a predetermined direction; and a first pad assembly arranged on the die and on a first side of the power bus, the first pad assembly comprising at least four pads separated from one another along the predetermined direction by gaps in the first pad assembly, the gaps in the first pad assembly comprising a first gap, a second gap and a third gap, the first gap and the second gap each having a width larger than a width of the third gap, the at least four pads in the first pad assembly comprising a power pad coupled to the power bus and located between the first gap and the second gap, the power pad and the first and the second gaps all located between opposing ends of the power bus;

testing the dies in the plurality of semiconductor structures in each of the plurality of wafers;

identifying a die with a circuit defect in any of the plurality of semiconductor structures as a target die;

cutting the power bus at the first gap and the second gap in the semiconductor structure with the target die; and stacking the plurality of wafers over each other, corresponding dies in neighboring wafers facing each other.

16. The method of claim 15, wherein, in each of the plurality of semiconductor structures, the at least four pads of the first pad assembly further comprises:

a first pad located on a first side of the power pad and adjacent to the power pad, the first pad and the power pad separated by the first gap;

a second pad located on a second side of the power pad opposing the first side of the power pad and adjacent to the power pad, the second pad and the power pad separated by the second gap; and a third pad located on a side of the first pad away from the power pad, the third pad and the first pad separated by the third gap.

17. The method of claim 15, wherein in each of the plurality of semiconductor structures, the width of at least one of the first gap and the second gaps is not smaller than 15 μm.

18. The method of claim 17, wherein each of the plurality of semiconductor structures further comprises:

a second pad assembly arranged on a second side of the power bus opposing the first side of the power bus, the second pad assembly comprising at least three pads separated from one another along the predetermined direction by gaps in the second pad assembly, the gaps in the second pad assembly comprising a fourth gap and a fifth gap, the fourth gap and the fifth gap each having a width larger the width of the third gap, the fourth gap facing toward the first gap, the fifth gap facing toward the second gap.

19. The method of claim 15, wherein cutting the power bus at the first gap and the second gap in the semiconductor structure with the target die comprises:

cutting the power bus with a laser at the first gap and the second gap in the semiconductor structure with the target die.

20. The method of claim 15, further comprising:

cutting the plurality of wafers stacked over each other along a gap between two adjacent semiconductor structures to slice the plurality of wafers stacked over each other.

\* \* \* \* \*